(12) United States Patent
Hormati

(10) Patent No.: US 11,575,549 B2
(45) Date of Patent: Feb. 7, 2023

(54) CONTINUOUS TIME LINEAR EQUALIZATION AND BANDWIDTH ADAPTATION USING ASYNCHRONOUS SAMPLING

(71) Applicant: Kandou Labs SA, Lausanne (CH)

(72) Inventor: Ali Hormati, Ecublens Vaud (CH)

(73) Assignee: KANDOU LABS SA, Lausanne (CH)

( * ) Notice: Subject to any disclaimer, the term of this patent is extended or adjusted under 35 U.S.C. 154(b) by 0 days.

(21) Appl. No.: 17/719,136

(22) Filed: Apr. 12, 2022

(65) Prior Publication Data

US 2022/0329470 A1 Oct. 13, 2022

Related U.S. Application Data

(63) Continuation of application No. 17/221,614, filed on Apr. 2, 2021, now Pat. No. 11,303,484.

(51) Int. Cl.
*H04L 27/01* (2006.01)
*H04L 7/00* (2006.01)

(52) U.S. Cl.
CPC ............ *H04L 27/01* (2013.01); *H04L 7/0079* (2013.01)

(58) Field of Classification Search
CPC .............................. H04L 27/01; H04L 7/0079
See application file for complete search history.

(56) References Cited

U.S. PATENT DOCUMENTS

| 3,636,463 A | 1/1972 | Ongkiehong |
|---|---|---|
| 3,824,494 A | 7/1974 | Wilcox |
| 3,939,468 A | 2/1976 | Mastin |
| 1,276,543 A | 6/1981 | Miller et al. |
| 1,774,498 A | 9/1988 | Traa |
| 4,897,657 A | 1/1990 | Brubaker |
| 5,017,924 A | 5/1991 | Guiberteau et al. |
| 5,459,465 A | 10/1995 | Kagey |

(Continued)

FOREIGN PATENT DOCUMENTS

| CN | 104242839 A | 12/2014 |
|---|---|---|
| EP | 0425064 A2 | 5/1991 |

(Continued)

OTHER PUBLICATIONS

International Search Report and Written Opinion for PCT/US2022/022875, dated Jul. 5, 2022, 1-13 (13 pages).

(Continued)

*Primary Examiner* — Freshteh N Aghdam
(74) *Attorney, Agent, or Firm* — Invention Mine LLC

(57) ABSTRACT

Methods and systems are described for generating a time-varying information signal at an output of a continuous time linear equalizer (CTLE), asynchronously sampling a data signal according to a sampling clock having a frequency less than a data rate of the data signal; generating corresponding pattern-verified samples for at least two data patterns, each of the at least two data patterns having a respective frequency content; determining corresponding frequency-specific voltage measurements associated with each of the at least two data patterns based on the corresponding pattern-verified samples of the at least two data patterns; and adjusting an equalization of the data signal based on a comparison of the corresponding frequency-specific voltage measurements.

20 Claims, 9 Drawing Sheets

(56) References Cited

U.S. PATENT DOCUMENTS

| | | | |
|---|---|---|---|
| 5,510,736 A | 4/1996 | Van | |
| 5,748,948 A | 5/1998 | Yu et al. | |
| 5,777,568 A | 7/1998 | Inoue | |
| 5,793,254 A | 8/1998 | OConnor | |
| 5,945,935 A | 8/1999 | Kusumoto et al. | |
| 6,002,717 A * | 12/1999 | Gaudet | G02B 23/18 |
| | | | 375/232 |
| 6,094,075 A | 7/2000 | Garrett et al. | |
| 6,226,330 B1 | 5/2001 | Mansur | |
| 6,232,908 B1 | 5/2001 | Nakaigawa | |
| 6,346,907 B1 | 2/2002 | Dacy et al. | |
| 6,384,758 B1 | 5/2002 | Michalski et al. | |
| 6,396,329 B1 | 5/2002 | Zerbe | |
| 6,400,302 B1 | 6/2002 | Amazeen et al. | |
| 6,462,584 B1 | 10/2002 | Proebsting | |
| 6,546,063 B1 * | 4/2003 | Lee | H04L 25/03885 |
| | | | 375/232 |
| 6,563,382 B1 | 5/2003 | Yang | |
| 6,624,699 B2 | 9/2003 | Yin et al. | |
| 6,839,587 B2 | 1/2005 | Yonce | |
| 6,879,816 B2 | 4/2005 | Bult et al. | |
| 6,888,483 B2 | 5/2005 | Mulder | |
| 6,972,701 B2 | 12/2005 | Jansson | |
| 7,075,996 B2 | 7/2006 | Simon et al. | |
| 7,167,523 B2 | 1/2007 | Mansur | |
| 7,188,199 B2 | 3/2007 | Leung et al. | |
| 7,199,728 B2 | 4/2007 | Dally et al. | |
| 7,269,212 B1 | 9/2007 | Chau et al. | |
| 7,285,977 B2 | 10/2007 | Kim | |
| 7,372,295 B1 | 5/2008 | Wei | |
| 7,372,390 B2 | 5/2008 | Yamada | |
| 7,397,302 B2 | 7/2008 | Bardsley et al. | |
| 7,528,758 B2 | 5/2009 | Ishii | |
| 7,560,957 B2 | 7/2009 | Chen et al. | |
| 7,598,811 B2 | 10/2009 | Cao | |
| 7,635,990 B1 | 12/2009 | Ren et al. | |
| 7,656,321 B2 | 2/2010 | Wang | |
| 7,683,720 B1 | 3/2010 | Yehui et al. | |
| 7,688,102 B2 | 3/2010 | Bae et al. | |
| 7,688,887 B2 * | 3/2010 | Gupta | H04L 7/033 |
| | | | 375/232 |
| 7,697,915 B2 | 4/2010 | Behzad et al. | |
| 7,804,361 B2 | 9/2010 | Lim et al. | |
| 7,822,113 B2 | 10/2010 | Tonietto et al. | |
| 7,876,866 B1 * | 1/2011 | McAdam | H03L 7/0814 |
| | | | 375/220 |
| 7,957,472 B2 | 6/2011 | Wu et al. | |
| 8,000,664 B2 | 8/2011 | Khorram | |
| 8,030,999 B2 | 10/2011 | Chatterjee et al. | |
| 8,045,608 B2 * | 10/2011 | Dai | H04L 25/03057 |
| | | | 375/348 |
| 8,106,806 B2 | 1/2012 | Toyomura et al. | |
| 8,159,375 B2 | 4/2012 | Abbasfar | |
| 8,159,376 B2 | 4/2012 | Abbasfar | |
| 8,183,930 B2 | 5/2012 | Kawakami et al. | |
| 8,537,886 B1 | 9/2013 | Shumarayev et al. | |
| 8,547,272 B2 | 10/2013 | Nestler et al. | |
| 8,581,824 B2 | 11/2013 | Baek et al. | |
| 8,604,879 B2 | 12/2013 | Mourant et al. | |
| 8,643,437 B2 | 2/2014 | Chiu et al. | |
| 8,674,861 B2 | 3/2014 | Matsuno et al. | |
| 8,687,968 B2 | 4/2014 | Nosaka et al. | |
| 8,704,583 B2 | 4/2014 | Bulzacchelli et al. | |
| 8,791,735 B1 | 7/2014 | Shibasaki | |
| 8,841,936 B2 | 9/2014 | Nakamura | |
| 8,860,590 B2 | 10/2014 | Yamagata et al. | |
| 8,861,583 B2 * | 10/2014 | Liu | H04L 25/03057 |
| | | | 375/232 |
| 9,069,995 B1 | 6/2015 | Cronie | |
| 9,100,232 B1 | 8/2015 | Hormati et al. | |
| 9,106,462 B1 | 8/2015 | Aziz et al. | |
| 9,106,465 B2 | 8/2015 | Walter | |
| 9,148,087 B1 | 9/2015 | Tajalli | |
| 9,178,503 B2 | 11/2015 | Hsieh | |
| 9,281,785 B2 | 3/2016 | Sjöland | |
| 9,281,974 B1 | 3/2016 | Liu | |
| 9,292,716 B2 | 3/2016 | Winoto et al. | |
| 9,300,503 B1 | 3/2016 | Holden et al. | |
| 9,473,330 B1 | 10/2016 | Francese | |
| 9,705,708 B1 | 7/2017 | Jin et al. | |
| 9,743,196 B2 | 8/2017 | Kropfitsch | |
| 9,755,599 B2 | 9/2017 | Yuan et al. | |
| 9,780,979 B2 | 10/2017 | Sun et al. | |
| 9,917,607 B1 * | 3/2018 | Zhang | H04L 25/085 |
| 9,954,495 B1 | 4/2018 | Chen et al. | |
| 10,003,315 B2 | 6/2018 | Tajalli | |
| 10,193,716 B2 | 1/2019 | Hormati et al. | |
| 10,326,623 B1 | 6/2019 | Tajalli | |
| 10,491,365 B1 | 11/2019 | Lin | |
| 10,608,849 B1 | 3/2020 | Hormati | |
| 10,791,009 B1 | 9/2020 | Wu et al. | |
| 10,931,249 B2 | 2/2021 | Rattan et al. | |
| 2001/0006538 A1 | 7/2001 | Simon et al. | |
| 2002/0050861 A1 | 5/2002 | Nguyen et al. | |
| 2002/0149508 A1 | 10/2002 | Hamashita | |
| 2002/0158789 A1 | 10/2002 | Yoshioka et al. | |
| 2002/0174373 A1 | 11/2002 | Chang | |
| 2003/0016763 A1 | 1/2003 | Doi et al. | |
| 2003/0085763 A1 | 5/2003 | Schrodinger et al. | |
| 2003/0132791 A1 | 7/2003 | Hsieh | |
| 2003/0160749 A1 | 8/2003 | Tsuchi | |
| 2003/0174023 A1 | 9/2003 | Miyasita | |
| 2003/0184459 A1 | 10/2003 | Engl | |
| 2003/0218558 A1 | 11/2003 | Mulder | |
| 2004/0027185 A1 | 2/2004 | Fiedler | |
| 2004/0169529 A1 | 9/2004 | Afghani et al. | |
| 2005/0008099 A1 | 1/2005 | Brown | |
| 2005/0057379 A1 | 3/2005 | Jansson | |
| 2005/0218980 A1 | 10/2005 | Kalb | |
| 2005/0270098 A1 | 12/2005 | Zhang et al. | |
| 2006/0036668 A1 | 2/2006 | Jaussi et al. | |
| 2006/0097786 A1 | 5/2006 | Su et al. | |
| 2006/0103463 A1 | 5/2006 | Lee et al. | |
| 2006/0192598 A1 | 8/2006 | Baird et al. | |
| 2006/0194598 A1 | 8/2006 | Kim et al. | |
| 2007/0009018 A1 | 1/2007 | Wang | |
| 2007/0097579 A1 | 5/2007 | Amamiya | |
| 2007/0104299 A1 | 5/2007 | Cahn et al. | |
| 2007/0159247 A1 | 7/2007 | Lee et al. | |
| 2007/0176708 A1 | 8/2007 | Otsuka et al. | |
| 2007/0182487 A1 | 8/2007 | Ozasa et al. | |
| 2007/0188367 A1 | 8/2007 | Yamada | |
| 2007/0201546 A1 | 8/2007 | Lee | |
| 2007/0253475 A1 | 11/2007 | Palmer | |
| 2007/0285156 A1 | 12/2007 | Roberts et al. | |
| 2008/0001626 A1 | 1/2008 | Bae et al. | |
| 2008/0069276 A1 * | 3/2008 | Wong | H04L 25/03885 |
| | | | 375/350 |
| 2008/0107209 A1 | 5/2008 | Cheng et al. | |
| 2008/0165841 A1 | 7/2008 | Wall et al. | |
| 2008/0187037 A1 | 8/2008 | Bulzacchelli et al. | |
| 2009/0090333 A1 | 4/2009 | Spadafora et al. | |
| 2009/0115523 A1 | 5/2009 | Akizuki et al. | |
| 2009/0146719 A1 | 6/2009 | Pernia et al. | |
| 2009/0323864 A1 | 12/2009 | Tired | |
| 2010/0148819 A1 | 6/2010 | Bae et al. | |
| 2010/0156691 A1 | 6/2010 | Taft | |
| 2010/0219781 A1 | 9/2010 | Kuwamura | |
| 2010/0235673 A1 | 9/2010 | Abbasfar | |
| 2010/0271107 A1 | 10/2010 | Tran et al. | |
| 2011/0028089 A1 | 2/2011 | Komori | |
| 2011/0032977 A1 | 2/2011 | Hsiao et al. | |
| 2011/0051854 A1 | 3/2011 | Kizer et al. | |
| 2011/0057727 A1 | 3/2011 | Cranford et al. | |
| 2011/0096054 A1 | 4/2011 | Cho et al. | |
| 2011/0103508 A1 | 5/2011 | Mu et al. | |
| 2011/0105067 A1 | 5/2011 | Wilson | |
| 2011/0133816 A1 | 6/2011 | Wu et al. | |
| 2011/0156819 A1 | 6/2011 | Kim et al. | |
| 2012/0025911 A1 | 2/2012 | Zhao et al. | |
| 2012/0044021 A1 | 2/2012 | Yeh et al. | |
| 2012/0133438 A1 | 5/2012 | Tsuchi et al. | |
| 2012/0249217 A1 | 10/2012 | Fukuda et al. | |

(56) References Cited

U.S. PATENT DOCUMENTS

| | | | |
|---|---|---|---|
| 2013/0106513 | A1 | 5/2013 | Cyrusian et al. |
| 2013/0114663 | A1 | 5/2013 | Ding et al. |
| 2013/0147553 | A1 | 6/2013 | Iwamoto |
| 2013/0195155 | A1 | 8/2013 | Pan et al. |
| 2013/0215954 | A1 | 8/2013 | Beukema et al. |
| 2013/0259113 | A1 | 10/2013 | Kumar |
| 2013/0334985 | A1 | 12/2013 | Kim et al. |
| 2014/0119479 | A1 | 5/2014 | Tajalli |
| 2014/0176354 | A1 | 6/2014 | Yang |
| 2014/0177696 | A1 | 6/2014 | Hwang |
| 2014/0203794 | A1 | 7/2014 | Pietri et al. |
| 2014/0266440 | A1 | 9/2014 | Itagaki et al. |
| 2014/0312876 | A1 | 10/2014 | Hanson et al. |
| 2015/0070201 | A1 | 3/2015 | Dedic et al. |
| 2015/0146771 | A1 | 5/2015 | Walter |
| 2015/0198647 | A1 | 7/2015 | Atwood et al. |
| 2016/0013954 | A1 | 1/2016 | Shokrollahi et al. |
| 2016/0087610 | A1 | 3/2016 | Hata |
| 2016/0197747 | A1 | 7/2016 | Ulrich et al. |
| 2017/0085239 | A1 | 3/2017 | Yuan et al. |
| 2017/0104458 | A1 | 4/2017 | Cohen et al. |
| 2017/0214374 | A1 | 7/2017 | Tajalli |
| 2017/0244371 | A1 | 8/2017 | Turker Melek et al. |
| 2017/0302237 | A1 | 10/2017 | Akter et al. |
| 2017/0302267 | A1 | 10/2017 | Luo |
| 2017/0309346 | A1 | 10/2017 | Tajalli et al. |
| 2018/0076985 | A1* | 3/2018 | Schell ............... H04L 25/0262 |
| 2018/0227114 | A1* | 8/2018 | Rahman ............... H04L 7/0334 |
| 2018/0248723 | A1* | 8/2018 | Palmer ............... H04L 25/03273 |
| 2019/0109735 | A1* | 4/2019 | Norimatsu ............... H04L 25/03 |
| 2019/0199557 | A1 | 6/2019 | Taylor et al. |
| 2019/0221153 | A1 | 7/2019 | Tsuchi et al. |
| 2019/0379340 | A1 | 12/2019 | Rattan et al. |
| 2019/0379563 | A1 | 12/2019 | Tajalli et al. |
| 2020/0313841 | A1* | 10/2020 | Ulrich ............... H04L 7/0016 |
| 2020/0321778 | A1 | 10/2020 | Gharibdoust et al. |
| 2021/0248103 | A1* | 8/2021 | Khashaba ............... H04L 7/0087 |
| 2021/0281449 | A1 | 9/2021 | Wang et al. |
| 2022/0085967 | A1* | 3/2022 | Vrazel ............... H04L 7/0083 |

FOREIGN PATENT DOCUMENTS

| | | | | |
|---|---|---|---|---|
| EP | E P-2451129 | A2 * | 5/2012 | ....... H04L 25/03012 |
| WO | 2018052657 | A1 | 3/2018 | |
| WO | 2019241081 | A1 | 12/2019 | |

OTHER PUBLICATIONS

Anadigm , "Using the Anadigm Multiplier CAM", Design Brief 208, www.anadigm.com, Copyright 2002, 2002, (6 pages).

Bae, Joonsung , et al., "Circuits and Systems for Wireless Body Area Network", Electromagnetics of Body-Area Networks: Antennas, Propagation, and RF Systems, First Edition, 2016, 375-403 (29 pages).

Dickson, Timothy , et al., "A 1.8 pJ/bit 16×16 Gb/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

Kim, Kyu-Young , et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Palmisano, G. , et al., "A Replica Biasing for Constant-Gain CMOS Open-Loop Amplifiers", Circuits and Systems, IEEE International Symposium in Monterey, CA, May 31, 1998, 363-366 (4 pages).

Schneider, J. , et al., "ELEC301 Project: Building an Analog Computer", http://www.clear.rice.edu/elec301/Projects99/anlgcomp/, Dec. 19, 1999, (9 pages).

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

Takahashi, Masayoshi , et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Tierney, J., "A Digital Frequency Synthesizer", Audio and Electroacoustics, IEEE Transactions, pp. 48-57, vol. 19, No. 1, Abstract, Mar. 1971, (1 page).

Wang, Hui , et al., "Equalization Techniques for High-Speed Serial Interconnect Transceivers", Solid-State and Integrated-Circuit Technotogy, 9th International Conference on ICSICT, Piscataway, NJ, Oct. 20, 2008, 1-4 (4 pages).

Terzopoulos, Nikolaos , et al., "A 5-Gbps USB3.0 Transmitter and Receiver Liner Equalizer", International Journal of Circuit Theory and Applications, vol. 43, No. 7, Feb. 28, 2014, 900-916 (17 pages).

* cited by examiner

Waveform 710

Waveform 720

Waveform 730

CONTINUOUS TIME LINEAR EQUALIZATION AND BANDWIDTH ADAPTATION USING ASYNCHRONOUS SAMPLING

CROSS-REFERENCE TO RELATED APPLICATIONS

This application is a continuation of U.S. application Ser. No. 17/221,614, filed Apr. 2, 2021, naming Ali Hormati, entitled "Continuous Time Linear Equalization and Bandwidth Adaptation Using Asynchronous Sampling", which is hereby incorporated herein by reference in its entirety for all purposes.

REFERENCES

The following prior applications are herein incorporated by reference in their entirety for all purposes:

U.S. Pat. No. 9,100,232, filed Feb. 2, 2015 as application Ser. No. 14/612,241 and issued Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi].

U.S. Pat. No. 10,193,716, filed Apr. 28, 2017 as application Ser. No. 15/582,545, naming Ali Hormati and Richard Simpson, entitled "Clock Data Recovery Utilizing Decision Feedback Equalization", hereinafter identified as [Hormati I].

U.S. Pat. No. 10,608,849, filed Apr. 8, 2019 as application Ser. No. 16/378,455 and issued Mar. 31, 2020, naming Ali Hormati, entitled "Variable Gain Amplifier and Sampler Offset Calibration without Clock Recovery", hereinafter identified as [Hormati II].

U.S. patent application Ser. No. 16/378,461, filed Apr. 8, 2019, naming Suhas Rattan and Kiarash Gharibdoust, entitled "Amplifier with Adjustable High-Frequency Gain using Varactor Diodes", hereinafter identified as [Rattan].

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods such as described in [Shokrollahi] have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device are sampled (or their signal value otherwise recorded) at intervals best representing the original transmitted values, regardless of transmission channel delays, interference, and noise. This Clock and Data Recovery (CDR) not only must determine the appropriate sample timing, but must continue to do so continuously, providing dynamic compensation for varying signal propagation conditions. It is common for communications receivers to extract a receive clock signal from the received data stream. Some communications protocols facilitate such Clock Data Recovery or CDR operation by constraining the communications signaling so as to distinguish between clock-related and data-related signal components. Similarly, some communications receivers process the received signals beyond the minimum necessary to detect data, so as to provide the additional information to facilitate clock recovery. As one example, a so-called double-baud-rate receive sampler may measure received signal levels at twice the expected data reception rate, to allow independent detection of the received signal level corresponding to the data component, and the chronologically offset received signal transition related to the signal clock component.

Real-world communications channels are imperfect, degrading transmitted signals in both amplitude (e.g. attenuation) and timing (e.g. delay and pulse smearing) which may be addressed via transmitter pre-compensation and/or receive equalization. Continuous time linear equalization (CTLE) is one known approach to frequency domain equalization, in one example providing compensation for increased channel attenuation at high frequencies. Time-domain-oriented equalization methods are also used to compensate for the effects of inter-symbol-interference or ISI on the received signal. Such ISI is caused by the residual electrical effects of a previously transmitted signal persisting in the communications transmission medium, so as to affect the amplitude or timing of the current symbol interval. As one example, a transmission line medium having one or more impedance anomalies may introduce signal reflections. Thus, a transmitted signal will propagate over the medium and be partially reflected by one or more such anomalies, with such reflections appearing at the receiver at a later time in superposition with signals propagating directly.

One method of data-dependent receive equalization is Decision Feedback Equalization or DFE. Here, the time-domain oriented equalization is performed by maintaining a history of previously-received data values at the receiver, which are processed by a transmission line model to predict the expected influence that each of the historical data values would have on the present receive signal. Such a transmission line model may be precalculated, derived by measurement, or generated heuristically, and may encompass the effects of one or more than one previous data interval. The predicted influence of these one or more previous data intervals is collectively called the DFE compensation. At low to moderate data rates, the DFE compensation may be calculated in time to be applied before the next data sample is detected, as example by being explicitly subtracted from the received data signal prior to receive sampling, or implicitly subtracted by modifying the reference level to which the received data signal is compared in the receive data sampler or comparator. However, at higher data rates the detection of previous data bits and computation of the DFE compensation may not be complete in time for the next data sample, requiring use of so-called "unrolled" DFE computations performed on speculative or potential data values rather than known previous data values. As one example, an unrolled DFE stage may predict two different compensation values depending on whether the determining data bit will resolve to a one or a zero, with the receive detector performing sampling or slicing operations based on each of those predictions, the multiple results being maintained until the DFE decision is resolved.

BRIEF DESCRIPTION

A digital receiver system samples received signals in both amplitude and time, obtaining sufficient information to permit accurate detection and decoding of the transmitted data regardless of signal degradations induced by the communications medium. As the communications medium may introduce significant signal attenuation, signal receivers often incorporate variable gain amplifiers and equalizers that must be properly configured to enable signal detection. Methods and systems are described herein for performing measurements on and adjustments of continuous time linear equalizer settings that operates before fully synchronous receiver operation begins.

Methods and systems are described for generating a time-varying information signal at an output of a continuous time linear equalizer (CTLE), by asynchronously sampling a data signal according to a sampling clock having a frequency less than a data rate of the data signal; generating corresponding pattern-verified samples for at least two data patterns, each of the at least two data patterns having a respective frequency content; determining corresponding frequency-specific voltage measurements associated with each of the at least two data patterns based on the corresponding pattern-verified samples of the at least two data patterns; and adjusting an equalization of the data signal based on a comparison of the corresponding frequency-specific voltage measurements.

DETAILED DESCRIPTION

Figure 1:
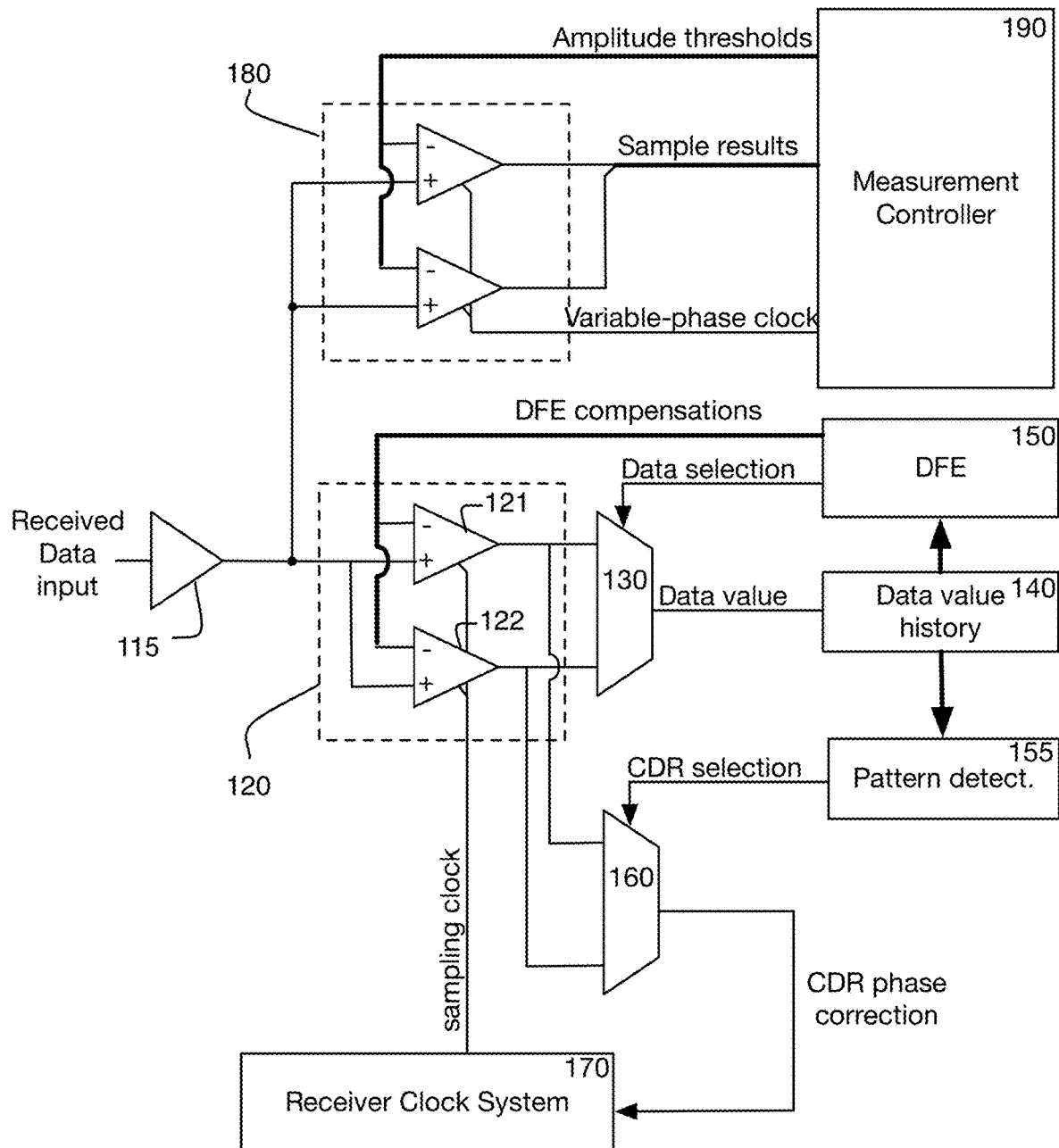
FIG. 1 is a block diagram of a receiver, in accordance with some embodiments.

In recent years, the signaling rate of high speed communications systems have reached speeds of tens of gigabits per second, with individual data unit intervals measured in picoseconds. One example of such a system is given by [Shokrollahi], which describes use of vector signaling codes over extremely high bandwidth multiwire data communications links, such as between two integrated circuit devices in a system. Depending on the particular coding scheme used, the number of channels comprising such a communications link may range from two to eight or more, and may also communicate one or more clock signals, either within data channels or on separate communications channels.

In one embodiment utilizing a vector signaling code, multiple bits of data are encoded at the transmitter into a vector signaling "codeword", i.e. a set of symbols to be transmitted essentially simultaneously over the multiple wires or channels of the communication medium. As each such wire or channel may take on more than two possible values, each symbol of the codeword is drawn from an alphabet of allowable signal values; in examples of [Shokrollahi], alphabets of four and ten values are used in encodings of five data bits into six symbol codewords. In the receiver, the multilevel wire signals are detected to determine the received codeword, which is then decoded (e.g. by a mapping table lookup) into received data.

In an alternative embodiment, it is noted that each vector signaling codeword is a superposition of "subchannel" components, each such subchannel being an orthogonal mode or pattern of modulation of the wires or channels. Thus, in the example of [Shokrollahi], five subchannels may be summed to produce the transmitted signals, each subchannel modulated by one of the five transmitted data bits. Similarly, a vector signaling code receiver may directly detect the combination of received wire signals corresponding to a particular subchannel, as one example by using a multi-input comparator (MIC) performing a weighted summation of two or more wire signals correlated with the orthogonal mode of that subchannel, and directly producing one bit of received data. In the example of [Shokrollahi], full decoding of five data bits is shown using a set of MICs combining from two to six wire signals. As codeword and subchannel processing models are fully equivalent, interoperation is assured regardless of the particular encoding and decoding model used, e.g. allowing combination of a codeword transmitter with a MIC-based subchannel receiver based on the same orthogonal vector signaling code.

As previously mentioned, wire signals in an orthogonal vector signaling code system may take on multiple distinct values, while detected subchannel results (as one example, the results of weighted summation as at the output of a multi-input comparator or MIC) are typically binary, thus receive processing functions may be performed more efficiently on the simpler subchannel signals rather than on the more complex wire signals. In this document, these subsequent processing functions are described as being performed on a "receive signal", which without limitation may represent a detected subchannel result as obtained from a MIC, or a wire signal of a legacy signaling method.

Conventional practice for a high-speed integrated circuit receiver terminates each received signal channel, subchannel, or wire signal in a sampling device. This sampling device performs a measurement constrained in both time and amplitude dimensions; in one example embodiment, it may be composed of a sample-and-hold circuit that constrains the time interval being measured, followed by a threshold detector or digital comparator that determines whether the signal within that interval falls above or below (or in some embodiments, within bounds set by) a reference value. Alternatively, a digital comparator may determine the signal amplitude followed by a clocked digital flip-flop capturing the result at a selected time. In other embodiments, a combined time- and amplitude-sampling circuit is used, sampling the amplitude state of its input in response to a clock transition. In some embodiments, the time at which a sample is captured may be adjusted in some or all of the receiver samplers; in some embodiments, the threshold level to which a sample is compared may be adjusted, in some or all of the receiver samplers.

For descriptive convenience, this document will use the term sampling device, or more simply "sampler" to describe the receiver component that obtains an input measurement, as it implies both the time and amplitude measurement constraints, rather than the equivalent but less descriptive term "slicer" also used in the art. In some embodiments, the time at which a sample is captured may be adjusted in some or all of the receiver samplers; in some embodiments, the threshold level to which a sample is compared may be adjusted in some or all of the receiver samplers. As one example, the well-known receiver "eye plot" diagram is typically obtained by iterative adjustment of these parameters, with the results plotted graphically as signal amplitudes over time.

Clock Data Recovery

Clock Data Recovery or Clock Data Alignment (CDR or CDA) circuits as in [Hormati I] extract timing information, either from the data lines themselves or from dedicated clock signal inputs, and utilizing that extracted information to generate clock signals to control the time interval used by received signal sampling device. The actual clock extraction may be performed using well known circuits such as a Phase Locked Loop (PLL) or Delay Locked Loop (DLL), which in their operation may also generate higher frequency internal clocks, multiple clock phases, etc. in support of receiver operation. Implementation distinctions between CDR and CDA embodiments as described in the art are irrelevant to the present descriptions, thus the term CDA will subsequently be used herein as a generic identifier, without implying limitation.

In one common CDA embodiment, a first sample time is configured to optimally obtain the data sample, and a second sample time is configured to optimally determine whether the phase of the internal clock remains aligned with incoming signal transitions, which may be as much as ½ of a received signal unit interval (UI) offset in time from the optimum data sampling time. As sampling in such embodiments occurs twice per received unit interval, such systems are described as utilizing a double baud rate CDA. Such systems are very common in low speed communications systems or where the received signal exhibits very sharp transitions, i.e. where there is significant displacement in time between observation of a signal transition and optimum sampling of data. More advanced CDA systems may utilize a single sample time to obtain both data and clock phase information, in some cases performing these measurements at different sampling thresholds, and/or as part of particular signal transition patterns.

Receive Signal Equalization

At high data rates, even relatively short and high-quality communications channels exhibit considerable frequency-dependent signal loss, thus it is common for data receivers to incorporate receive signal equalization. Continuous-time Linear Equalization (CTLE) is commonly used to provide increased high frequency gain in the receive signal path, in compensation for the increased high frequency attenuation of the channel. Signal path attenuation may also require additional signal amplification at the receiver to provide sufficient signal amplitude for detection. Such embodiments will additionally include a Variable Gain Amplifier or VGA in the receive signal path.

It has also become common practice for data communications receivers to incorporate Decision Feedback Equalization (DFE) to compensate for signal propagation anomalies in the communications medium. The DFE system performs non-linear time-domain equalization on the received signal by maintaining a history of previously-received data values at the receiver, and processing those historic data values with a transmission line model to predict the expected influence each of the historical data values would have on the present receive signal. Such a transmission line model may be pre-calculated, derived by measurement, or generated heuristically, and may encompass the effects of one or more than one previous data interval.

In a typical receiver design, this computed DFE compensation value will be applied to the current receive signal input to produce a corrected signal more accurately representing the received data symbol value. The DFE compensation value produced as described above cannot be calculated until the previous unit interval's data value has been detected. Thus, as data rates increase, a point will be reached at which the information to produce the DFE compensation value is not available in time to be applied to the next unit interval sampling. Indeed, at the highest data rates currently used in practice, this situation may exist for multiple previous unit intervals, as the detection time for a single data value may represent multiple unit interval durations, requiring the receiver to pipeline or parallelize the detection operation. Thus, it is common for embodiments to forgo such "closed loop" DFE methods for one or more of the most recent unit intervals, instead relying on an "open loop" or "unrolled loop" generation of one or more elements of the DFE compensation value for these most recent unit intervals.

In an effort to accelerate such DFE operation, some embodiments speculatively produce DFE compensation values corresponding to each of the possible detected data values for a given unit interval. One embodiment incorporates multiple data detection samplers, each provided with a distinct value of DFE compensation associated with the possible detected data values for one or more previous unit intervals. The result of each sampler is stored until the previous data value is known, at which time the corresponding stored result is selected for data detection.

The set of DFE compensation values speculatively created to represent the constellation of potential detected data results over the previous transmit unit interval or intervals represent a set of measurement levels spanning some portion of the receive signal amplitude range. As an example, previous transmission of consecutive "zero" signals might lead to a predicted lower threshold level for a subsequent receiver data measurement incorporating speculative DFE compensation, while previous transmission of consecutive "one" signals might lead to a predicted higher threshold level for the same data measurement. Thus, for any data measurement used to detect an actual data value, the described multiple-sampler receiver will potentially perform other measurement operations using thresholds either too high or too low for the actual signal during that interval.

Example Embodiment

For purposes of description and without implying limitation, a simple serial data receiver as shown in FIG. 1 will be used as an example. This example receiver includes one or more stages of DFE computation 150 based on a history of received data values 140, and a receiver clock system 170 to produce a sampling clock, the phase of which may be adjusted by a CDA correction to optimize data sampling timing. Particular data transitions identified as indicators of clock phase alignment are identified by data pattern detector 155, which then directs 160 the qualified edge sample to the receiver clock system 170. As shown, the data samplers include comparators 120 sampling the received signal provided by a continuous time linear equalizer (CTLE) 115, with sample timing controlled by the sampling clock.

In some embodiments, an apparatus includes two comparators 120 configured to generate two comparator outputs, the two comparators configured to compare a received time-varying information signal to a first threshold as at 121 and a second threshold as at 122, according to a sampling clock. The first and second thresholds may correspond to decision feedback equalization (DFE) factors that are determined by an estimated amount of inter-symbol interference on a multiwire bus. The apparatus may further include a data decision selection circuit 130 configured to select one of the two comparator outputs as a data decision, the selection based on at least one prior data decision that may be stored in data value history 140. The apparatus further includes a phase-error indication selection circuit 160 configured to select one of the two comparator outputs as a phase-error indication in response to receiving a CDR selection signal from a pattern detection circuit 155 configured to identify a predetermined data decision pattern in the data value history storage 140.

In some embodiments, one or more spare samplers 180 provide enhanced measurement capability. In one mode, one or more spare samplers 180 may be configured to gather eye scope data, using Amplitude threshold(s) and/or a Sample clock other than that of a data sampler, as provided by Measurement Controller 190. In another mode, samplers 180 may be configured to utilize the same sampling clock phase as samplers 120. In one embodiment, data pattern detection circuit 155 may be used to qualify eye scope data being gathered. In a further embodiment, said samples are counted or otherwise recorded to provide a statistical sample of measurements at the selected threshold and clock phase, qualified by the selected receive data pattern.

In some embodiments, the apparatus further includes a receiver clock system 170 configured to receive the phase-error indication and to responsively adjust a phase of the sampling clock. In some embodiments, the phase-error indication is an early/late logic decision on a transition of the received signal. In some embodiments, the data decision selection circuit 130 and phase-error indication circuit 160 select different comparator outputs.

In some embodiments, the apparatus further includes a decision-feedback equalization (DFE) circuit 150 configured to generate the first and second thresholds.

In some embodiments, the apparatus further includes a sub-channel detection multi-input comparator (MIC, not shown) operating on signals received via a plurality of wires, the sub-channel detection MIC configured to generate the received data input signal. In such embodiments, the signals received via the plurality of wires correspond to symbols of a codeword of a vector signaling code, the codeword corresponding to a weighted summation of a plurality of sub-channel vectors, each sub-channel vector being mutually orthogonal. In such an embodiment, the inter-symbol interference is sub-channel specific, the sub-channel specific ISI corresponding to modulation of components of a corresponding sub-channel vector associated with the received signal. In some embodiments, sub-channel specific ISI associated with each sub-channel vector is mutually orthogonal. In some embodiments, the apparatus may further include a filter configured to filter the received signal prior to generating the comparator outputs.

Receive Channel Adjustment without CDA

As is readily apparent from the previous descriptions, the interactions between clock, equalization, and sampling are both interdependent and complex. Received data is obtained by sampling the amplified and equalized received signal, with accurate results depending on correct clock timing, which is derived from sampling the slope of a received signal transition, that slope in turn depending on the equalization applied to the received signal, which in turn may in part be derived from analysis of previously-detected received data.

During initial startup or initialization of the data receiver, the communication channel characteristics may be unknown, in particular it is not known how much the time-varying information signal generated by the transmitting device has been attenuated, thus providing no indication of how much receiver front-end gain or equalization should be applied to provide an acceptable signal amplitude for the receive data detectors and a transitional slope compatible with the CDA method being used.

In the absence of a detected data stream, the receive clock or CDA subsystem is not phase locked, and may thus typically free-run at some frequency that may be significantly different than that of the transmitted data stream, precluding normal use of receive signal samplers. In some embodiments, the free-running rate of the receiver's phase lock loop clock system may approximate that of the transmitter, as one example within 20% of nominal frequency. In other embodiments, the initial rate of the PLL may be substantially different, in some instances a factor of two or more higher or lower in frequency. In some embodiments, a rough adjustment of the free-running PLL frequency may be made to reduce lock-in time and reduce the probability of locking to a multiple or fraction of the actual received data rate.

Many receiver systems do not provide any hardware support allowing actual measurement of signal amplitudes. Instead, sampler(s) merely indicate whether, at the time they are triggered by the sampling clock, the input signal was above or below the sampler threshold. Without CDA lock, it is not known where a given measurement of the time-varying information signal is made during a given signaling interval, each such measurement being made at what are essentially arbitrary moments in each sequential signaling interval.

Figure 2:
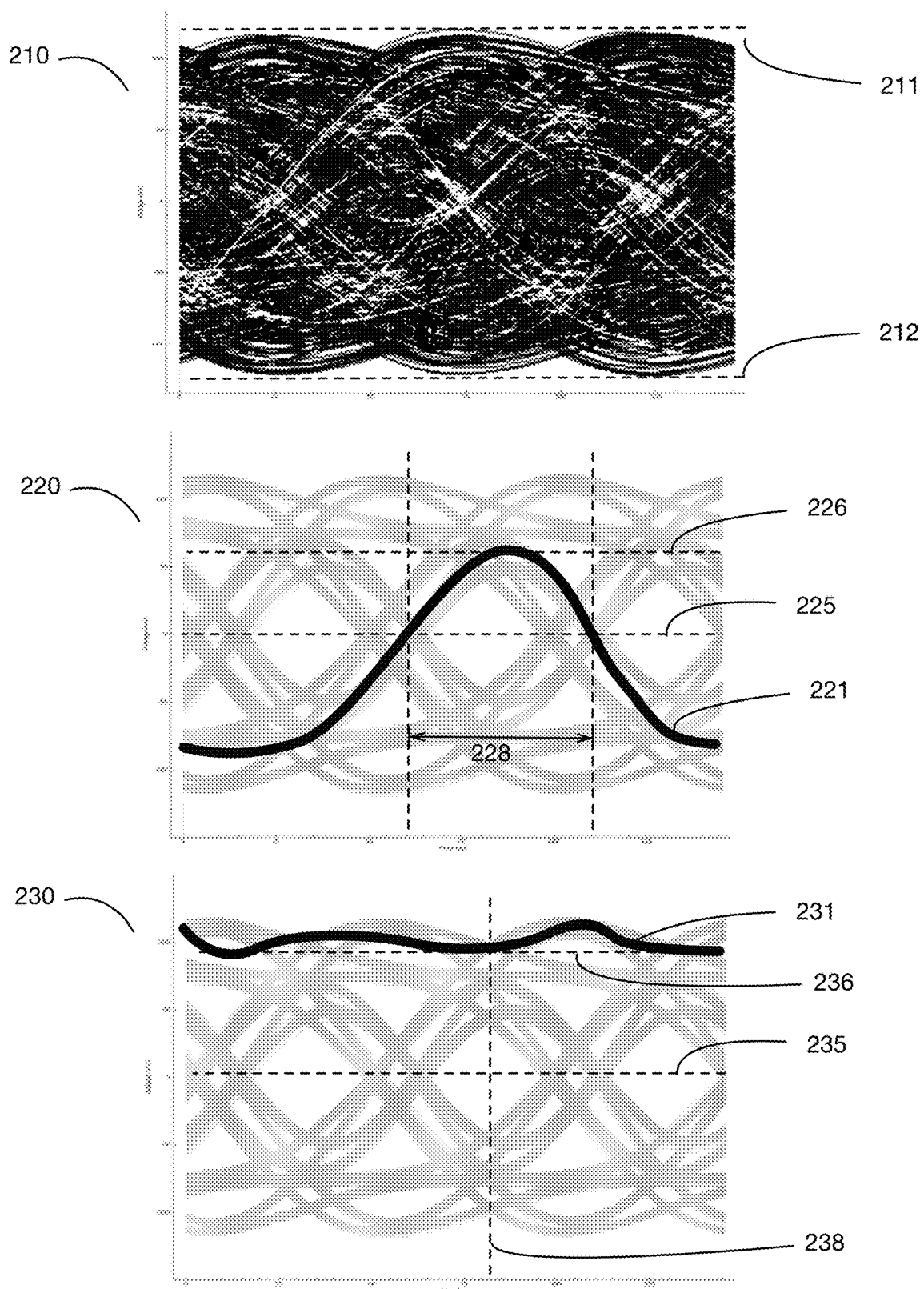
FIG. 2 illustrates several examples of receive signals.

As taught in [Hormati II], one embodiment takes advantage of the lack of sampling clock lock during this initial startup period to allow the data samplers to statistically estimate overall input signal amplitude, and thus to estimate the upper and lower bounds for the time-varying information signal. If the receiver sampling clock were locked as in normal data detector operation, these upper and lower bounds would typically be described as "top of eye" and "bottom of eye", referencing elements of the well-known eye diagram model for received signal detection. As the clock is not locked, the time-varying information signal is sampled asynchronously, and the relationship between the asynchronous samples and the sampling time at the center of the eye as will be determined by the CDR are arbitrary and will vary from sample to sample. So, in one example of [Hormati II] illustrated here in 210 of FIG. 2, a sampling threshold 211 may be incrementally increased until no signal is found that exceeds that level, thus representing a positive amplitude peak. A comparable procedure may be repeated while incrementally decreasing the sampling threshold 212, until the negative amplitude peak is found. Sampling thresholds between these two extremes will thus be expected to obtain both '1' and '0' sampled results, with the results being at least in part dependent on the transmitted data.

Figure 5:
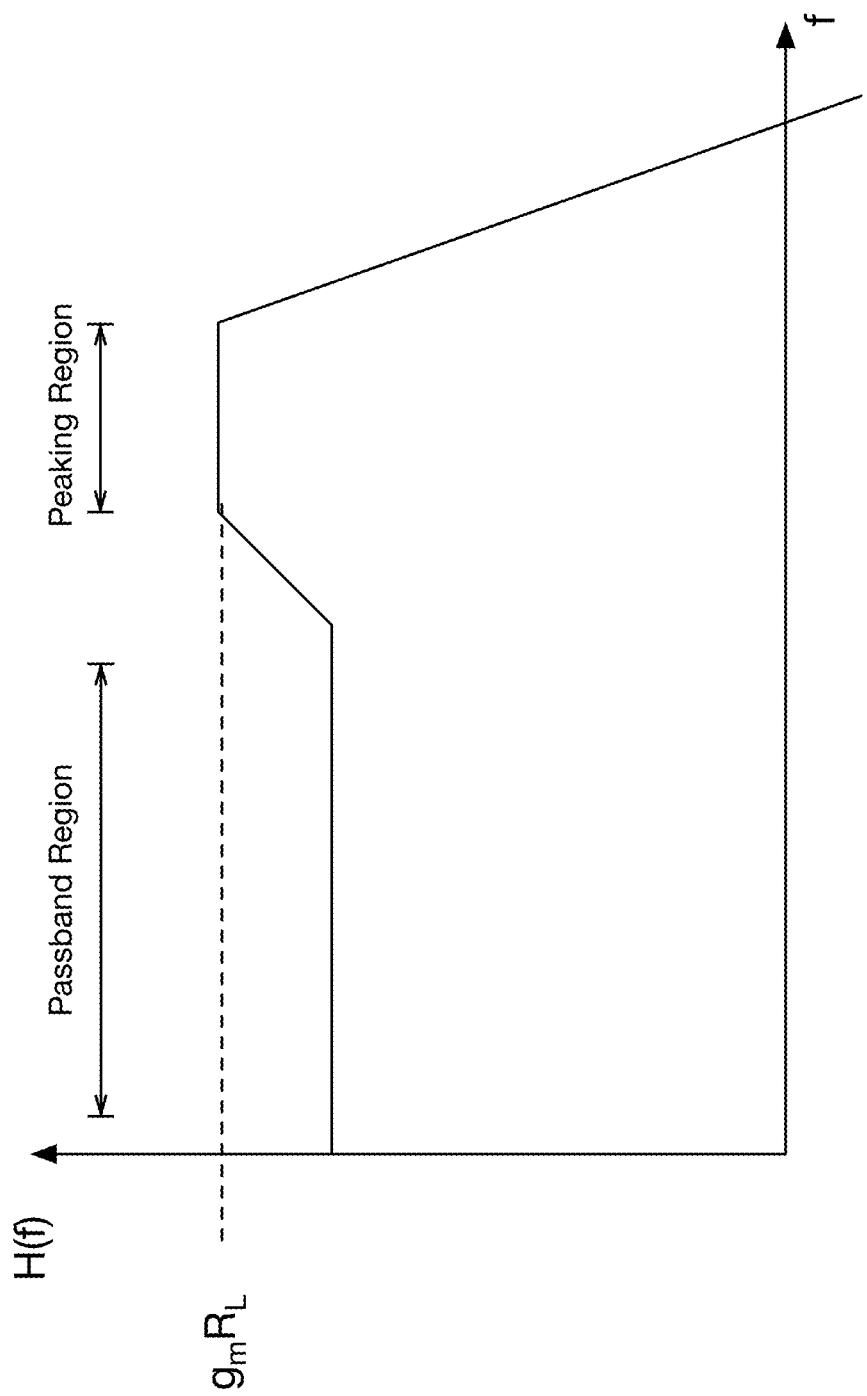
FIG. 5 is a frequency spectrum of a high-frequency peaked data signal.
Figure 9:
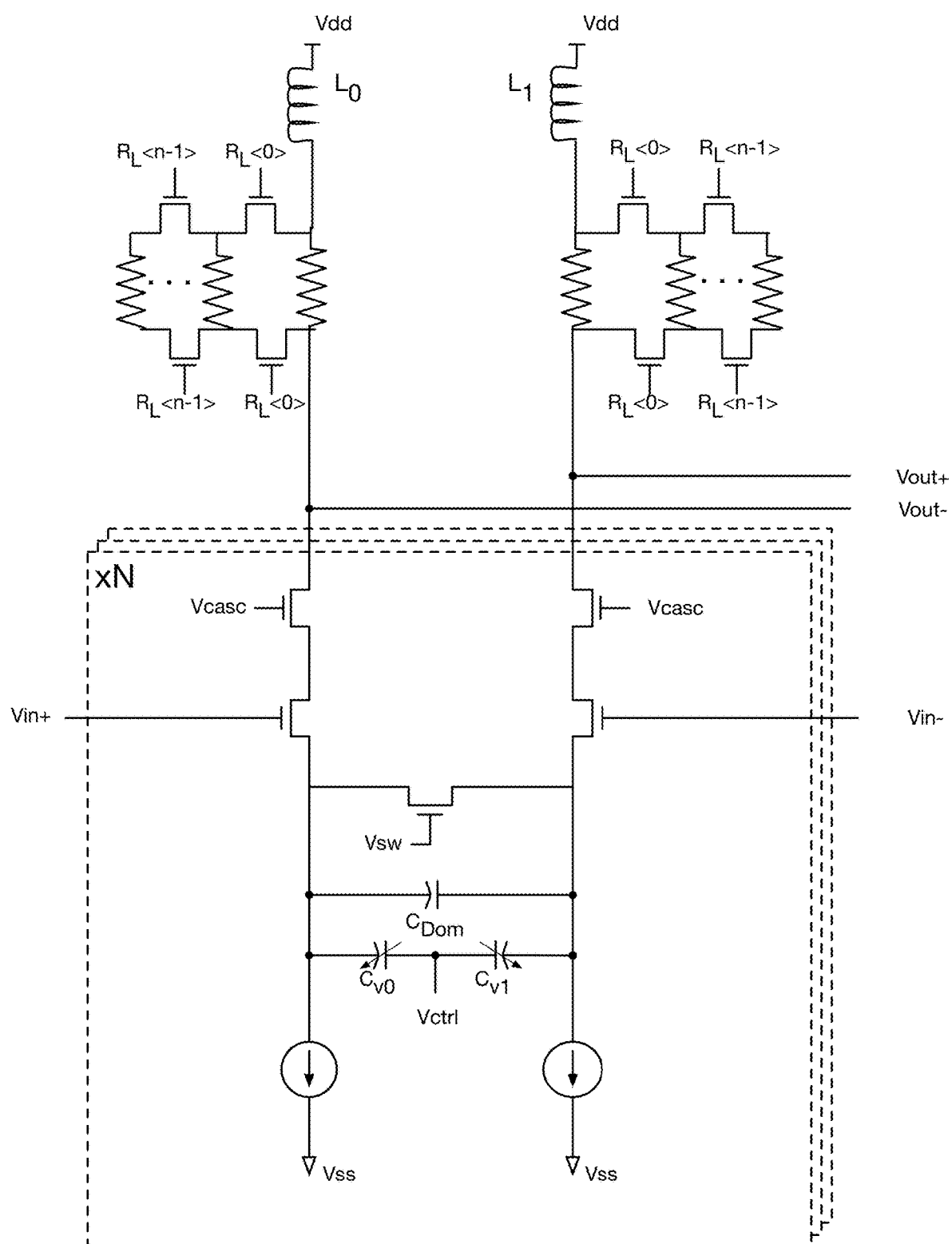
FIG. 9 is a schematic of a CTLE that may be used in accordance with some embodiments.

This asynchronous sampling approach may be extended to allow initial adjustment of CTLE characteristics. FIG. 5 is a waveform illustrating high frequency peaking characteristics for a CTLE, such as the CTLE described in [Rattan]. An exemplary embodiment of the CTLE of [Rattan] is given in FIG. 9, which includes a tunable load resistance shared by a plurality of slices having tunable capacitances, and tunable source impedance elements. For descriptive simplicity and without implying limitation, the following example assumes that the CTLE response of FIG. 5 may be described as two regions; a low frequency or "passband" region, and a high frequency or "peaking" region. As shown, the high-frequency peaking region has a gain associated with the transconductance ($g_m$) and load resistance ($R_L$) of the CTLE. The transition frequency between these two regions, i.e. the "breakpoint frequency", is determined by at least one pole and zero of the circuit's overall transfer function which may be determined e.g., by a resistive and capacitive values of the high frequency peaking circuit of the CTLE. In embodiments described below, one data pattern may generate a signal waveform with more energy located within the passband region (the 000 or 111 patterns) as compared to the second pattern that has more high-frequency energy associated with the peaking region (the 101 or 010 patterns).

It may be further observed that a data pattern incorporating alternating '0' and '1' bits will have significant signal energy at the Nyquist frequency (i.e. with a period of 2*UI for this repeating '01' pattern) and conversely sequences incorporating repetitions of the same bit value will have less energy at the Nyquist frequency, compared to the signal energy at lower frequencies (e.g. with a period of 6*UI for a repeating '000111' pattern). As the Nyquist frequency of the received signal is generally close to or within the CTLE peaking region, this implies that changes to the CTLE peaking amplitude have a greater effect on the amplitude of the former pattern, compared to the latter pattern.

Assuming that initial receive signal gain and sampling thresholds are set, the output of the receive samplers will be a bit sequence dependent on (but due to the unoptimized sampling threshold, unlocked clock, and lack of advanced equalization such as DFE, differing from) the transmitted data.

In one embodiment, the pattern detection 155 subsystem used to identify qualifying CDR clock edge samples is configured to detect the chosen frequency-related signal patterns. Received sequences so identified are herein called pattern-verified samples. Using the same naming convention used in previous disclosures, the bit patterns to be matched by pattern detection are identified as triplets of the form: [previous data value, current data value, subsequent data value]. Thus, the pattern '010' identifies a received data sequence that previously was data '0', currently has a data value of '1', but then subsequently returns to a data value of '0'. In practice, inherent processing delays and the use of speculative DFE preclude real-time matching and sample identification. Instead, sampled results are stored in a latch, flip/flop, memory, multi-bit register, or various other storage devices, and all DFE and CDA decisions (as well as qualification of eye scope results such as pattern-verified samples) are made after-the-fact, based on these stored results.

During normal data signaling operation, the pattern-verification of this information is made using the pattern detector 155 examining the received data stream obtained from data samplers 120, which have both a fixed threshold and fixed sampling instant. As described below, the data samplers 120 may operate according to a non-fixed sampling instant to asynchronously sample the data signal, gathering statistical eye information at various horizontal offsets throughout the data signaling eye.

It should be noted that in the example embodiment of FIG. 1, the sampling phase of data samplers 120 is fixed by the phase of the sampling clock. Similarly, the sampling threshold of data samplers 120 is essentially fixed, although the thresholds for samplers 121 and 122 are offset from that fixed value by +H1 and −H1 (i.e. the first speculative DFE compensation term provided by DFE subsystem 150.) Thus, pattern verification of a given sample is performed using a historic record of data values obtained from sampler 120 using a fixed threshold and fixed clock phase. The actual sample information, however, is obtained from sampler 180, configured to sample with the same clock phase as 120, but with a sampling threshold independently controlled by Measurement controller 190.

Initially, receive signal gain and an initial sampling threshold should be set (e.g. as in [Hormati II]), CTLE high frequency or peaking amplitude should be set to its maximum amount, and any CTLE bandwidth limitation capability should be disabled.

To improve the probability of detecting pattern-verified samples, one embodiment configures the receive clock system to adjust the free-running frequency of the sampling clock to between 80 and 95 percent of the expected locked rate.

In an embodiment incorporating speculative DFE such as that of FIG. 1, DFE may be disabled while asynchronously sampling the data signal, and in some such scenarios the amplitude of the H1 DFE term minimized so that the two data samplers 120 are sampling at the same threshold level. Sampler 180 may also be configured to use this same initial sampling level, 225 in FIG. 2.

In a first set of measurements, pattern detection is configured to identify a high frequency sequence, this example using the transitional data pattern '010'. As previously noted, pattern detection is based on data sampling occurring at fixed vertical threshold 225, thus waveform 220 shows a data trajectory 221 which satisfies this pattern, allowing the current result (e.g. the '1') to be accurately determined as long as the data signal is asynchronously sampled during timing window 228 by sampler 180. It may be plausible that false-negatives (e.g., sampling outside of sampling window 228, indicating a '0' during the signaling interval), and false-positives may occur, however such errors are filtered out, as the input signal is asynchronously sampled for a period of time to allow a statistically significant number of pattern-verified samples to be identified.

If a statistically significant number of pattern-verified samples are identified as being '1' rather than '0' (i.e. the sampled signal exceeded the variable threshold,) the vertical decision threshold 225 is incrementally increased and the asynchronous sampling process repeated. In some embodiments, the decision threshold 225 is adjusted until a ratio of pattern-verified '1' samples to pattern-verified '0' samples are detected, providing an approximate averaged signal value associated with the transitional data pattern. Alternatively, the decision threshold 225 may be adjusted until pattern-verified '1' samples are no longer be identified, and thus the threshold may correspond to the highest amplitude 226 (i.e. a frequency-specific voltage measurement) associated with this first data pattern.

In a second set of measurements, pattern detection is configured to identify a low frequency sequence, this example using the pattern '111'. Again, relative to fixed sampling threshold 235, data trajectory 231 satisfies the pattern, allowing the current result (e.g. the '1') to be sampled at time 238 by sampler 180. The input signal is again asynchronously sampled in this way for a period of time to allow a statistically significant number of pattern-verified samples to be identified.

If a statistically significant number of pattern-verified samples are identified as being '1' rather than '0' (i.e. the sampled signal exceeded the variable threshold,) the threshold is incrementally increased and the asynchronous sampling process repeated. When pattern-verified '1' samples can no longer be identified (or alternatively a similar ratio described above, in some examples for a low-frequency pattern a 50-50 ratio), the threshold 236 corresponds to the low frequency amplitude (i.e. a frequency-specific voltage measurement) associated with this second data pattern.

The CTLE characteristics and thus the equalization of the data signal may then be adjusted based on a comparison of the corresponding frequency-specific voltage measurements. In some embodiments, the two measurements are compared ratiometrically relative to a predetermined or target value. In one such embodiment, it is desired that there is a 2:1 ratio of low-frequency to high-frequency amplitudes. If the calculated ratio of the first and second measurements is greater than this target, the adjustment algorithm exits with the CTLE characteristics unchanged. If the ratio is less, the CTLE peaking equalization is decreased, and the measurement process repeated. If CTLE peaking has been decreased to its minimum value, bandwidth limiting characteristics may be applied as well by adjusting e.g., the load resistance of the CTLE.

In some embodiments, the second measurement may commence at the ending threshold of the first measurement (e.g. 226) rather than at initial threshold value 225. In some embodiments, incremental decreases to the threshold value are made to determine a lower rather than, or in addition to, an upper frequency-specific voltage measurement. In some embodiments, the peak-to-peak amplitudes of the frequency-specific signals are so determined, and the ratios are computed based on those amplitudes. In some embodiments, the interval in which pattern-verified samples are identified may be abbreviated, if sufficient pattern-verified signals are detected. In an alternative embodiment, the number of pattern matches is counted and each measurement continues for a predetermined number of pattern matches. In some embodiments, a predetermined tolerance level or threshold may be applied to comparisons of a computed measurement ratio to a target. Other patterns may be used in alternative embodiments to identify low- and high-frequency signal components. In further embodiments, additional pattern-verified samples are used to assist in configuring additional CTLE passband characteristics, including additional frequency-dependent filter regions associated with additional poles and zeroes of the CTLE transfer function.

Figure 3:
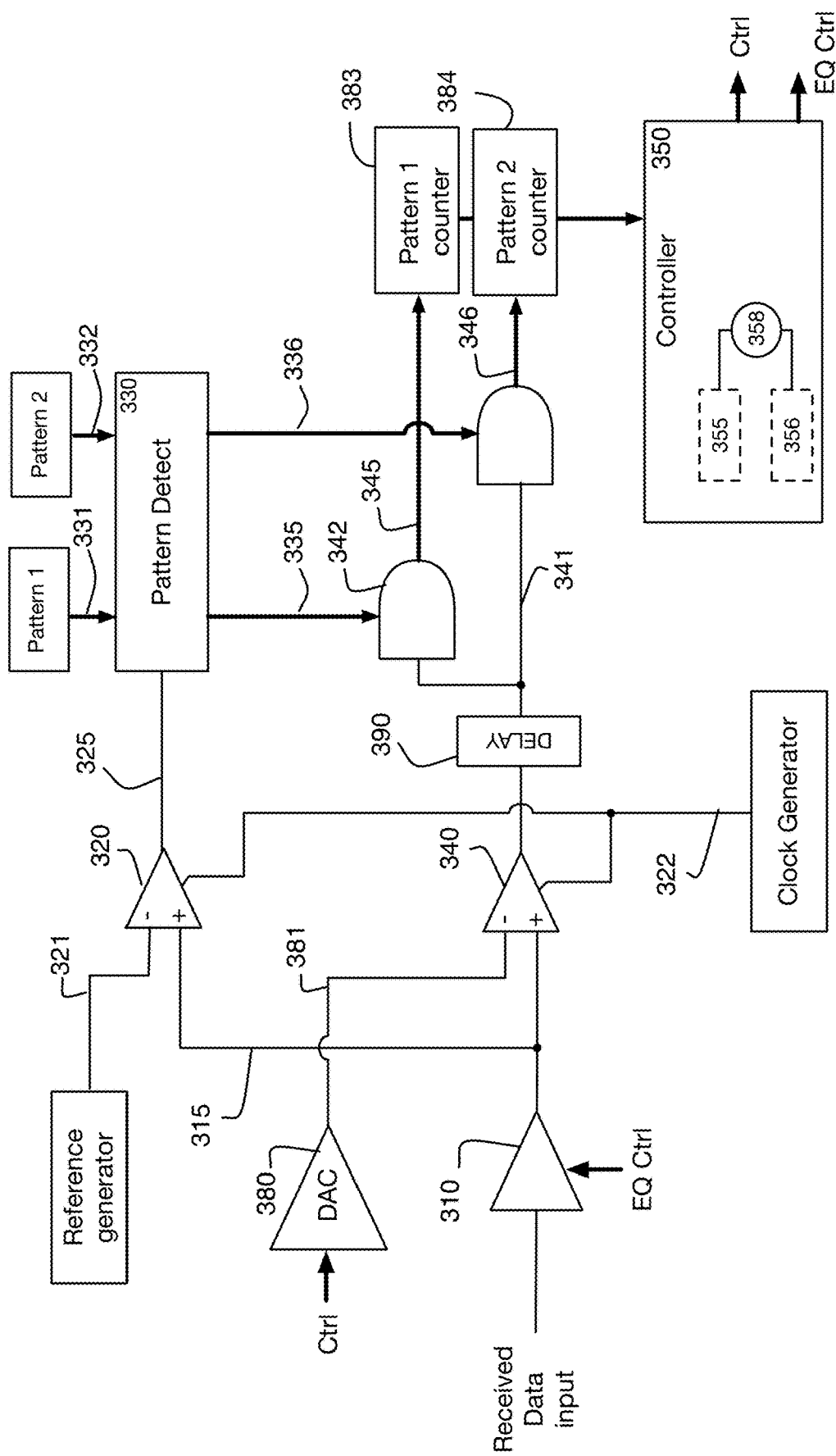
FIG. 3 is a block diagram of an apparatus in accordance with some embodiments.

FIG. 3 illustrates one embodiment of an apparatus, in accordance with some embodiments. As shown, FIG. 3 includes a first sampler 320 having a reference decision threshold 321 generated by e.g., a band gap reference generator. Sampler 320 is configured to asynchronously sample data signal 315 using a sampling clock 322 having a frequency less than a data rate of the data signal. In some embodiments, the frequency of the sampling clock is approximately 80-95% of the data rate.

FIG. 3 includes pattern detection circuit 330 configured to detect at least two different data patterns 331/332, each of the at least two data patterns having different frequency content. The sampled data stream 325 is continuously compared to each of the configured data patterns 331 and 332. If the sequence of data samples on 325 matches a configured data pattern, a verification indicator 335 or 336 is output associated with the respective pattern. In some embodiments, the frequency of how often each data pattern occurs may be counted using e.g., pattern counters 383 and 384 As described above, the two data patterns have different frequency content. In one particular example, the frequency content of a first data pattern may be associated with the passband region (the 000 or 111 patterns) of FIG. 5 while the frequency content of a second data pattern is associated with the peaking region (the 101 or 010 patterns) of FIG. 5. In some embodiments the first data pattern is a non-transitional data pattern while the second data pattern is a transitional data pattern. In further embodiments, the frequency content of the transitional data pattern is a minimum distance from the frequency content of the non-transitional data pattern as determined e.g., on the CTLE curve of FIG. 5.

In some embodiments, the frequency of the first data pattern incorporating alternating '0' and '1' bits will have significant signal energy at the Nyquist frequency (i.e. with a period of 2*UI for this repeating '01' pattern) and conversely the second data pattern will have less energy at the Nyquist frequency, compared to the signal energy at lower frequencies (e.g. with a period of 6*UI for a repeating '000111' pattern).

FIG. 3 further includes second sampler 340 having a variable decision threshold 381, the second sampler configured to generate corresponding pattern-verified samples 345/346 for the at least two data patterns responsive to detection of a corresponding data pattern 335/336 of the at least two data patterns 331 and 332. As shown in FIG. 3, the second sampler 340 may be a spare sampler operating outside of a data signaling processing path and may be used e.g., to find eye measurement data and/or calibration purposes.

The variable threshold 381 is shown here as being generated by digital-to-analog converter (DAC) 380, as configured by a control signal 'Ctrl' generated by controller 350. Sampler output 341 measured at variable threshold 381 and time 322, is qualified by gates 342 and 343 acting upon pattern verification indicators 335 and 336 respectively generated by pattern detection circuit 330 to produce pattern-verified samples 345 and 346 respectively for Pattern 1 and Pattern 2. In some embodiments, pattern detection circuit 330 may include logic circuits configured to analyze consecutive decisions 325 generated by data sampler 320. In one non-limiting example, the logic circuits may include logical three-input AND gates having inverted and non-inverted inputs associated with a particular data pattern. For descriptive simplicity without implying limitation, these pattern-verified samples are shown as being accumulated 383 and 384 for subsequent evaluation by controller 350. In some embodiments, the counters 383 and 384 may be updated based on the pattern-verified samples 345 and 346, respectively, wherein the updates are in directions determined by the value of the pattern-verified samples. In one embodiment without implying limitation, counters 383 and 384 are multi-bit registers where a least-significant bit (LSB) portion is updated based on each pattern-verified sample for the given pattern. In some embodiments, the same LSB may be incremented and decremented according to the pattern-verified samples until a 50-50 ratio is achieved, in which case the MSB has been resolved to the frequency-specific voltage measurement associated with the given data pattern. Alternative embodiments may increment and decrement different locations, instituting a 1:N ratio of confidence in the frequency-specific voltage measurement where N is the distance between the different locations.

The MSB portions of counters 383 and 384 may be provided as a control signal to e.g., DAC 380 to control the decision threshold of spare sampler 340. In some embodiments, the frequency-specific voltage measurements are measured consecutively, i.e., spare sampler 340 is used to find the frequency-specific voltage measurement for pattern 1 and then subsequently to find the frequency-specific voltage measurement for pattern 2. In at least on alternative embodiment, the apparatus may include an additional spare sampler (not shown) and the frequency-specific voltage measurements may be made for patterns 1 and 2 concurrently.

As previously noted, conventional notation for data patterns is of the form [previous, current, subsequent], thus as previously discussed there is a timing skew in using such a match result to qualify a [current] sample. For illustrative purposes, delay 390 is shown as postponing arrival to node 341 of each sample captured by second sampler 340 until the corresponding pattern-verification information is available.

Controller 350 is configured to update the variable decision threshold 381 of the second sampler 340 (by so configuring DAC 380) as state above to generate corresponding frequency-specific voltage measurements for each of the at least two data patterns 331/332. Once each frequency-specific voltage measurement is made, it may be stored in a corresponding register 355/356 associated with each of the at least two data patterns 331/332. In some embodiments, Controller 350 includes an embedded microprocessor executing a software program. In other embodiments, Controller 350 is a finite state machine consisting of logic gates and registers, performing a predetermined sequence of operations.

Figure 6:
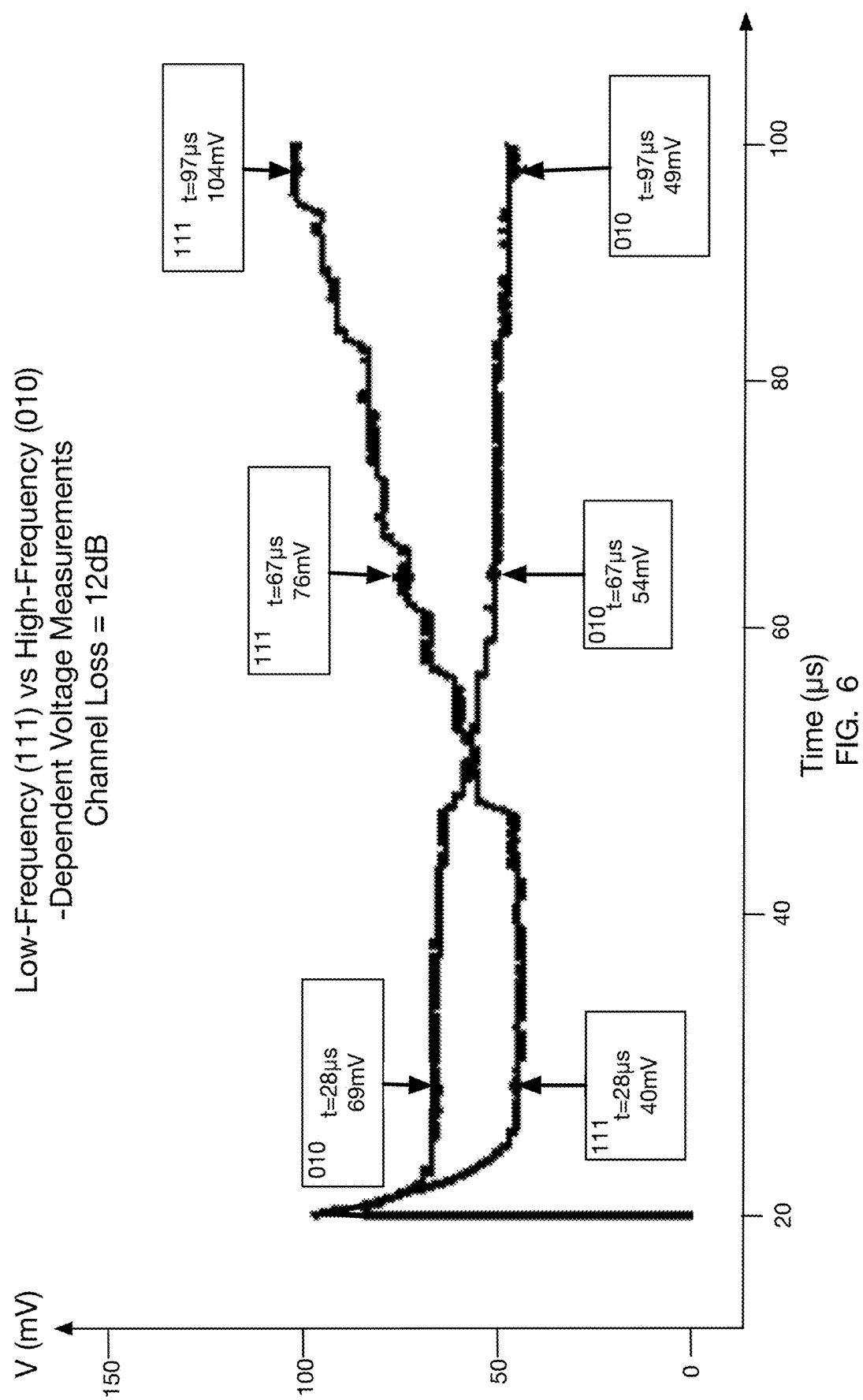
FIG. 6 illustrates frequency-specific voltage measurements of two data patterns over incremental changes to equalization of an input data signal.

Controller 350 is further configured to provide a control signal 'EQ Ctrl' to equalizer 310 to adjust an equalization of the data signal 315 responsive to a comparison 358 of the frequency-specific voltage measurements 355 and 356. FIG. 3 illustrates this operation by showing 355 and 356 as internal variables being compared 358 by controller 350. Control signals 'Ctrl' and 'EQ Ctrl' indicate the configuration capabilities of Controller 350 with respect to DAC 380 and equalizer 310, respectively. In some embodiments, controller 350 may also create and modify patterns used by Pattern Detection circuit 330. In some embodiments, the controller 350 is configured to adjust the equalization of the input data signal until a ratio of the frequency-specific voltage measurements 355 and 356 is within a predetermined threshold. FIG. 6 illustrates incremental updates to the equalization over time until the ratio of the frequency-dependent voltage measurement of the '111' pattern to the frequency-dependent voltage measurement of the '010' pattern is within a threshold of the predetermined ratio. In one non-limiting embodiment, the ratio of the frequency-dependent voltage measurement of the '111' pattern to the frequency-dependent voltage measurement of the '010' pattern is approximately 2. The embodiment of FIG. 6 assumes a high-loss channel having loss of approximately 20 dB, however such channel characteristics should not be considered limiting.

Figure 7:
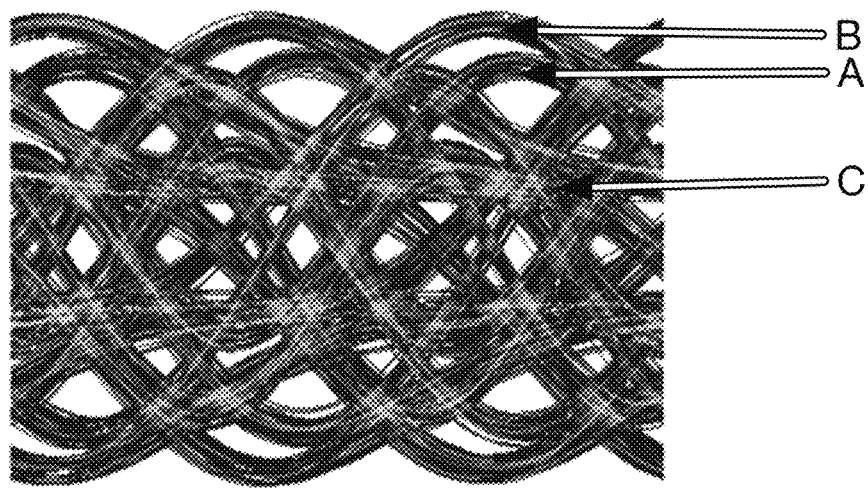
FIG. 7 illustrates waveforms of the equalized input data signal according to various equalization settings.
Figure 7:
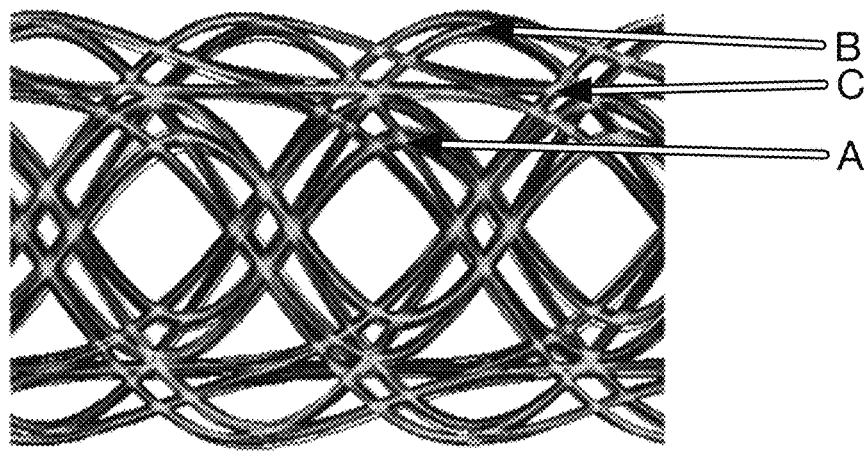
Figure 7:
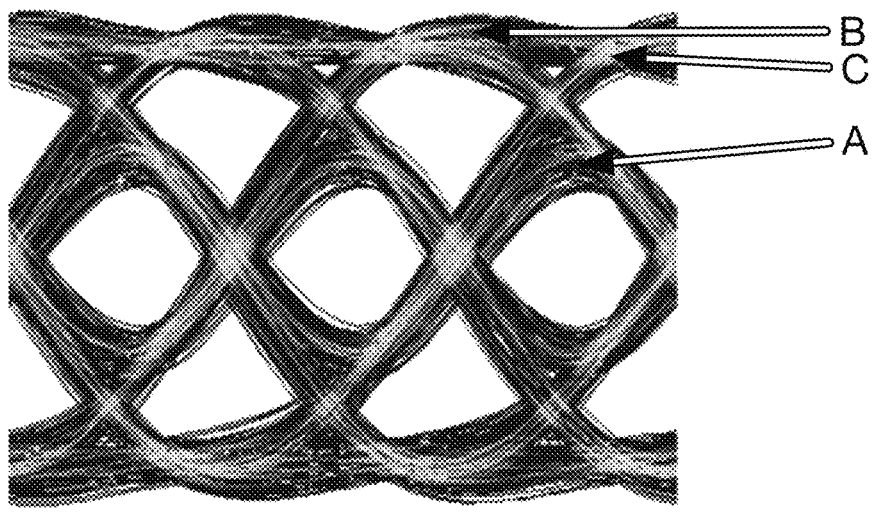

FIG. 7 shows examples of a waveform composed of low-, mid-, and high-frequency signal components in differing ratios. Waveform 710 in FIG. 7 is the result of a large ratio of high frequency to low-frequency gain. Thus, the peak-to-peak or envelope amplitude of this signal is influenced primarily by the energy of that high and mid frequency spectrum range. The waveform 710 may correspond to the equalization of the input signal at time t=28 μs as shown in FIG. 6. As shown, waveform 710 illustrates that high-frequency 010 patterns and mid-frequency 011 (peaking at points A and B, respectively) far overshoot the peak of low-frequency pattern 111 (point C).

As the incremental decreases in equalization continues, as shown at time t=97 μs, the peak 'A' of the high-frequency 010 pattern has decreased, and the ratio of the peak signal amplitudes of low-frequency components of the input signal to high-frequency components of the input signal is approximately 1.4:1. The waveform 720 in FIG. 7 may correspond to an eye diagram of the input signal at time t=67 μs, As further shown by waveform 720, the peak 'B' of the mid-frequency '011' pattern is still larger than the peak 'C' of the low-frequency '111' pattern.

The high-frequency peaking of the input signal may further be reduced until the ratio of signal amplitudes of the low-frequency components of the input signal to the high-frequency components of the input signal approaches approximately 2:1, shown in FIG. 6 at time t=97 μs. the waveform 730 of FIG. 7 depicts the input signal at this equalization setting, and as shown in waveform 730 the low- and mid-frequency peaks 'C' and 'B' are approximately equal while the peak signal amplitude 'A' of the high-frequency component of the input signal is approximately half.

Figure 8:
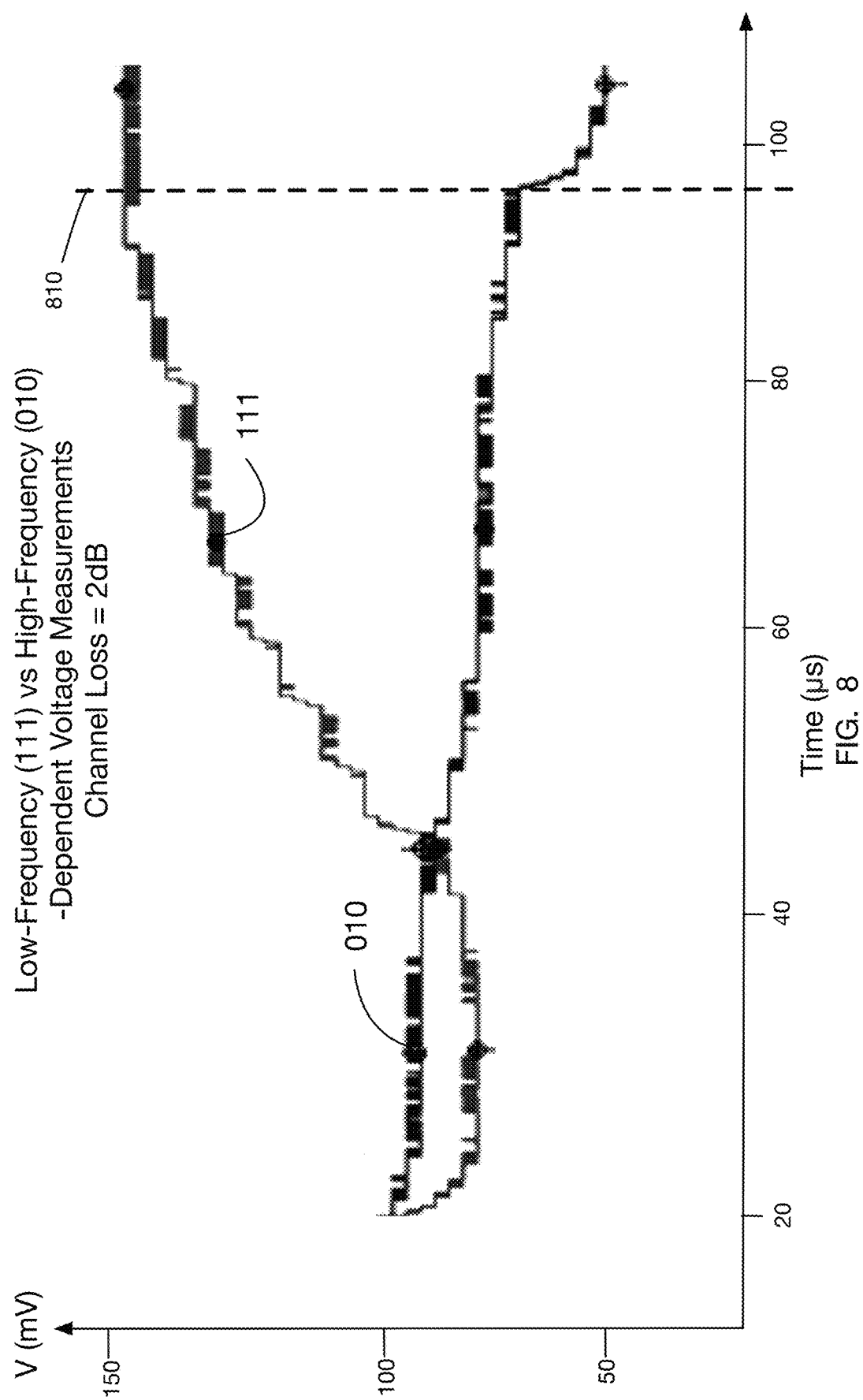
FIG. 8 illustrates frequency-specific voltage measurements of two data patterns over incremental changes to equalization of an input data signal received over a low-loss channel, in accordance with some embodiments.

Some embodiments may include channels with very little loss, e.g., 2 dB of channel loss. FIG. 8 illustrates incremental calibration of the equalization settings similar to FIG. 6, however in the scenario of a very low-loss channel. As shown in FIG. 8, the high-frequency peaking of the input signal is reduced until point 810, which corresponds to the minimum CTLE setting. In such embodiments, additional adjustments may be made to e.g., the bandwidth control as described above. Up to point 810, the amount of low-frequency gain is adjusted relative to the high-frequency gain, which remains relatively constant, aside from marginal loss due to a non-ideal physical system. After point 810, explicit adjustments are made to the amount of high-frequency gain (i.e., the magnitude of the "peaking" region of FIG. 5) by adjusting e.g., the load resistance $R_L$ of the CTLE of FIG. 9.

Figure 4:
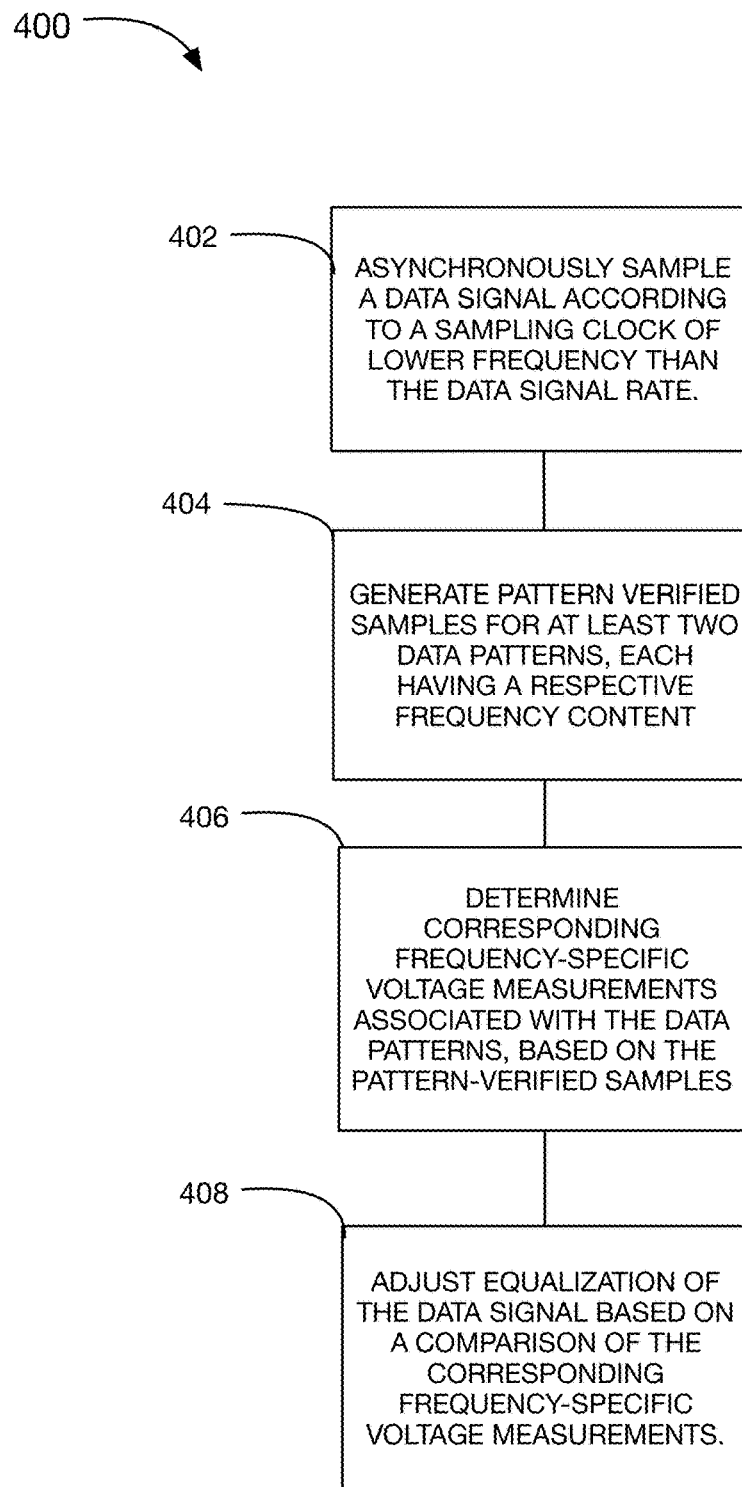
FIG. 4 is a flowchart of a method, in accordance with some embodiments.

FIG. 4 includes a method 400, in accordance with some embodiments. As shown, method 400 includes the steps of asynchronously sampling a data signal 402 according to a sampling clock having a frequency less than a data rate of the data signal; generating corresponding pattern-verified samples 404 for at least two data patterns, each of the at least two data patterns having a respective frequency content; determining corresponding frequency-specific voltage measurements 406 associated with each of the at least two data patterns based on the corresponding pattern-verified samples of the at least two data patterns; and adjusting an equalization of the data signal 408 based on a comparison of the corresponding frequency-specific voltage measurements.

We claim:

1. A method comprising:
asynchronously sampling a data signal using a sampler, having a reference decision threshold, according to a sampling clock having a frequency less than a data rate of the data signal to gather statistical eye information at various horizontal offsets throughout the data signaling eye;
detecting decision patterns indicative of either a first data pattern having a high transition density or a second data pattern having a low transition density;
determining an average peak signal value for each decision pattern; and
adjusting an equalization of the data signal based on a comparison of the average peak signal values for each decision pattern.

2. The method of claim 1, wherein determining the average peak signal value for each decision pattern comprises accumulating pattern-verified samples generated using at least one other sampler having a variable decision threshold, and adjusting the variable decision threshold based on an accumulated ratio of pattern verified samples above the variable decision threshold to pattern verified samples below the variable decision threshold.

3. The method of claim 2, wherein the variable decision threshold is adjusted until the accumulated ratio reaches a target ratio.

4. The method of claim 2, wherein the variable decision threshold is adjusted until pattern verified samples above the variable decision threshold are no longer detected.

5. The method of claim 2, wherein the average peak signal values for each decision pattern are determined using respective samplers of the at least one other sampler having respective variable decision thresholds.

6. The method of claim 2, wherein the average peak signal values for each decision pattern are determined consecutively using a single sampler of the at least one other sampler.

7. The method of claim 1, wherein the comparison of the average peak signal values for each decision pattern corresponds determining a ratiometric calculation of the average peak signal values is within a known threshold.

8. The method of claim 7, wherein the known threshold is approximately a 2:1 ratio of the average peak signal value for the decision pattern indicative of the first data pattern to the average peak signal value for the decision pattern indicative of the second data pattern.

9. The method of claim 1, wherein the first data pattern having the high transition density corresponds to a "010" data pattern or a "101" data pattern.

10. The method of claim 1, wherein the second data pattern having the low transition density corresponds to a "111" data pattern or a "000" data pattern.

11. An apparatus comprising:
a sampler having a reference decision threshold configured to asynchronously sample a data signal according to a sampling clock having a frequency less than a data rate of the data signal to gather statistical eye information at various horizontal offsets throughout the data signaling eye;
a pattern detection circuit configured to detect decision patterns indicative of either a first data pattern having a high transition density or a second data pattern having a low transition density;
a controller configured to determine an average peak signal value for each decision pattern and to responsively adjust an equalization of the data signal based on a comparison of the average peak signal values for each decision pattern.

12. The apparatus of claim 11, wherein the controller comprises an accumulator and at least one other sampler, the accumulator configured to accumulate pattern-verified samples generated using the at least one other sampler having a variable decision threshold, and wherein the controller is configured to adjust the variable decision threshold based on an accumulated ratio of pattern verified samples above the variable decision threshold to pattern verified samples below the variable decision threshold.

13. The apparatus of claim 12, wherein the controller is configured to adjust the variable decision threshold is until the accumulated ratio reaches a target ratio.

14. The apparatus of claim 12, wherein the controller is configured to adjust the variable decision threshold until pattern-verified samples above the variable decision threshold are no longer detected.

15. The apparatus of claim 12, wherein the at least one other sampler comprises two samplers, and wherein the average peak signal values for each decision pattern are determined using respective samplers of the two samplers having respective variable decision thresholds.

16. The apparatus of claim 12, wherein the at least one other sampler comprises one sampler, and wherein the average peak signal values for each decision pattern are determined consecutively using the one sampler.

17. The apparatus of claim 11, wherein the controller is configured to determine a ratiometric calculation of the average peak signal values is within a known threshold.

18. The apparatus of claim 17, wherein the known threshold is approximately a 2:1 ratio of the average peak signal value for the decision pattern indicative of the first data pattern to the average peak signal value for the decision pattern indicative of the second data pattern.

19. The apparatus of claim 11, wherein the first data pattern having the high transition density corresponds to a "010" data pattern or a "101" data pattern.

20. The apparatus of claim 11, wherein the second data pattern having the low transition density corresponds to a "111" data pattern or a "000" data pattern.

* * * * *